United States Patent [19]
McNeilly

[11] Patent Number: 4,542,346
[45] Date of Patent: Sep. 17, 1985

[54] WIDE-RANGE LOCK-IN AMPLIFIER
[75] Inventor: David R. McNeilly, Maryville, Tenn.
[73] Assignee: The United States of America as represented by the United States Department of Energy, Washington, D.C.
[21] Appl. No.: 447,728
[22] Filed: Dec. 7, 1982
[51] Int. Cl.$^4$ ............................................. H03D 3/06
[52] U.S. Cl. .................................... 328/165; 328/141; 328/160; 328/133; 328/134; 331/2
[58] Field of Search ............... 328/141, 160, 165, 133, 328/134; 331/2

[56] References Cited
U.S. PATENT DOCUMENTS
4,200,801  4/1980  Schuresko ........................... 250/458
4,426,622  1/1984  Rittenbach ......................... 329/143

OTHER PUBLICATIONS
E. H. Fisher, "Lock-In Amplifiers Obtain Measurements Even If There's More Noise Than Signal" Laser Focus, pp. 82–88, Nov. 1977.
D. Munroe, "The Heterodyning Lock-In Amplifier", Product Bulletin IAN-23, Ithaco, Inc., Mar. 1973.

Primary Examiner—Stanley D. Miller
Assistant Examiner—Richard Roseen
Attorney, Agent, or Firm—David E. Breeden; Stephen D. Hamel; Judson R. Hightower

[57] ABSTRACT

A lock-in amplifier is provided which allows detection of a signal buried in noise without preprocessing of the input signal. An analog signal multiplier is used to obtain a dc output which is the product of the signal being detected and a high-purity sine wave signal. A reference signal of a known selectable frequency is applied to a sine-wave generator to generate the sine wave of the same frequency. The sine wave is applied to a multiplier through a phase shift arrangement to allow the detection of both amplitude of the detected signal and the phases relative to the reference signal. The multiplier output is filtered by a low-pass filter to eliminate unwanted frequency components from the output signal.

4 Claims, 2 Drawing Figures

WIDE-RANGE LOCK-IN AMPLIFIER

BACKGROUND OF THE INVENTION

This invention is a result of a contract with the U.S. Department of Energy.

The invention relates generally to lock-in amplifiers and more specifically to improvements in lock-in amplifiers.

Lock-in amplifiers are generally used to detect ac signals buried in noise. Commercial lock-in amplifiers have made it possible to resolve signals where the signal-to-noise ratio is lower than 0.1.

A straight-forward application of conventional lock-in amplifiers is in situations where the frequency of the signal being resolved is known and unchanging. A slightly more complicated signal to resolve is one where the frequency is changing, but in a known way. An example is rotating machines. Here, the rotation speed of the machine is measured independently and applied as a reference frequency to the lock-in amplifier.

A considerably more complicated signal to resolve at low signal-to-noise ratios is an unknown frequency signal where the frequency might be changing with time. Spectrum analyzers have been used to resolve such signals. They incorporate a sweep generator that sweeps through a band of frequencies. When a frequency is encountered, that is in the unknown signal, an output results.

In each of the above applications, lock-in amplifiers generally apply the unknown signal to a phase detector as a means of comparing the unknown signal to the reference signal. The phase detector operates as a polarity reversing switch that switches the polarity of the unknown signal at a frequency equal to the desired detection frequency. This is equivalent to multiplying the unknown signal by a reference square wave of amplitude plus and minus one.

Such an action has the undesirable effect of adding spurious frequency components (odd harmonics) to the output signal. In the fixed frequency case, the odd harmonics can be successfully filtered out of the input signal, introducing a known error in the output. The conventional lock-in amplifier with its polarity reversing technique is adequate for these applications.

If, however, the signal being resolved is of unknown frequency or of known variable frequency, conventional spectrum analyzers using lock-in amplifiers prefilter the input signal to eliminate all odd harmonics of the reference frequency present in the input signal. This filtering alters the amplitude and phase of the unknown signal. These errors in turn are very difficult to compensate because the errors vary with frequency in an unknown way.

Conventional lock-in amplifiers take one of two approaches to make the necessary corrections. They either use a heterodyning technique with a fixed prefilter, or employ a tunable bandpass filter as a prefiltering element. If the prefiltering is done with a tunable bandpass filter, the lock-in amplifier tends to be difficult to implement reliably and hence, it is very expensive. Alternatively, heterodyning is a relatively complex technique and therefore it is also very expensive.

Thus, it will be obvious from the above discussion, that there is a need for a lock-in amplifier which is operable in all of the above input conditions and yet does not require the prefiltering of the signal, thereby eliminating the associated problems.

SUMMARY OF THE INVENTION

In view of the above need, it is the primary object of this invention to provide an inexpensive lock-in amplifier which does not require input signal processing.

Another object of this invention is to provide an inexpensive lock-in amplifier in accordance with the above object which is suitable for inclusion in precision instrumentation.

Additional objects, advantages, and novel features of the invention will be set forth in part, in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects, and in accordance with the purpose of the present invention, as embodied and broadly described herein, the lock-in amplifier of this invention may comprise a multiplier means having a first input for receiving an input signal in which a particular frequency component is to be detected and a second input for receiving a sine wave reference signal having a frequency substantially equal to the frequency of the signal being detected. The output of the multiplier is a dc signal which is indicative of the product of the frequency component being detected and the reference signal frequency. A sine wave generator means coupled to the second input of the multiplier provides the sine wave in response to an input reference signal having a frequency substantially equal to the frequency of the produced sine wave. A low-pass filter is connected in series with the output of the multiplier means.

A 90° phase shift circuit may be added after the sine wave generator to provide a cosine reference signal applied to another multiplier to give quadrature information.

Further, a variable frequency reference signal generator may be connected to the input of the sine wave generator to scan the input signal frequency, thus providing a very inexpensive spectrum analyzer.

BRIEF DESCRIPTION OF THE DRAWINGS

The accompanying drawings, which are incorporated in and form a part of the specification, illustrate an embodiment of the present invention and together with the description, serve to explain the principles of the invention.

DETAILED DESCRIPTION

Figure 1:
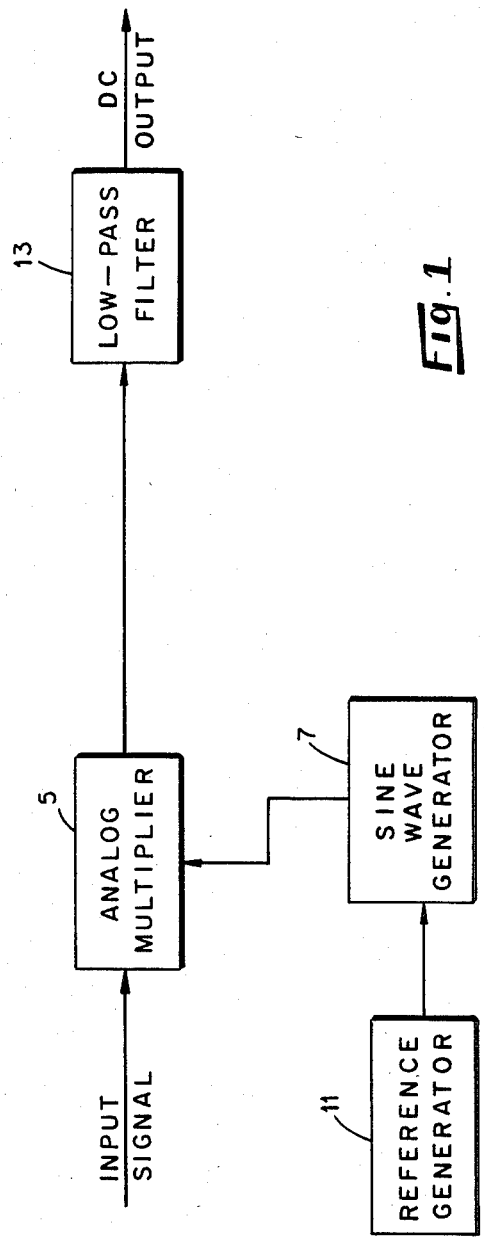
FIG. 1 is a simplified block diagram of a lock-in amplifier according to the present invention.

Referring now to FIG. 1, there is shown a lock-in amplifier in which an input signal having a particular signal frequency to be detected is applied to one input of an analog multiplier 5. A sine wave signal from a sine wave generator 7 is applied to another input of the analog multiplier. The frequency of the sine wave from generator 7 is determined by the frequency or pulse repetition rate of the reference signal applied to the reference input of the generator 7. This signal may be generated in various ways as by a reference pulse generator 11 shown in the drawing. The reference signal generator may take the form of a single frequency signal generator when the particular signal frequency to be detected is known. In applications where the signal frequency to be detected is unknown and buried in the input signal, the reference signal generator may take the form of a variable frequency, or pulse rate, signal generator which correspondingly varies the frequency of the sine wave generated and applied to the multiplier 5.

The output of the analog multiplier is a dc signal which is proportional to the product of the sine wave and any component of the input signal having the same frequency as the sine wave signal. The output of the multiplier is connected to a low-pass filter 13 which eliminates all of the frequency components from the output signal, leaving only the desired dc components.

Figure 2:
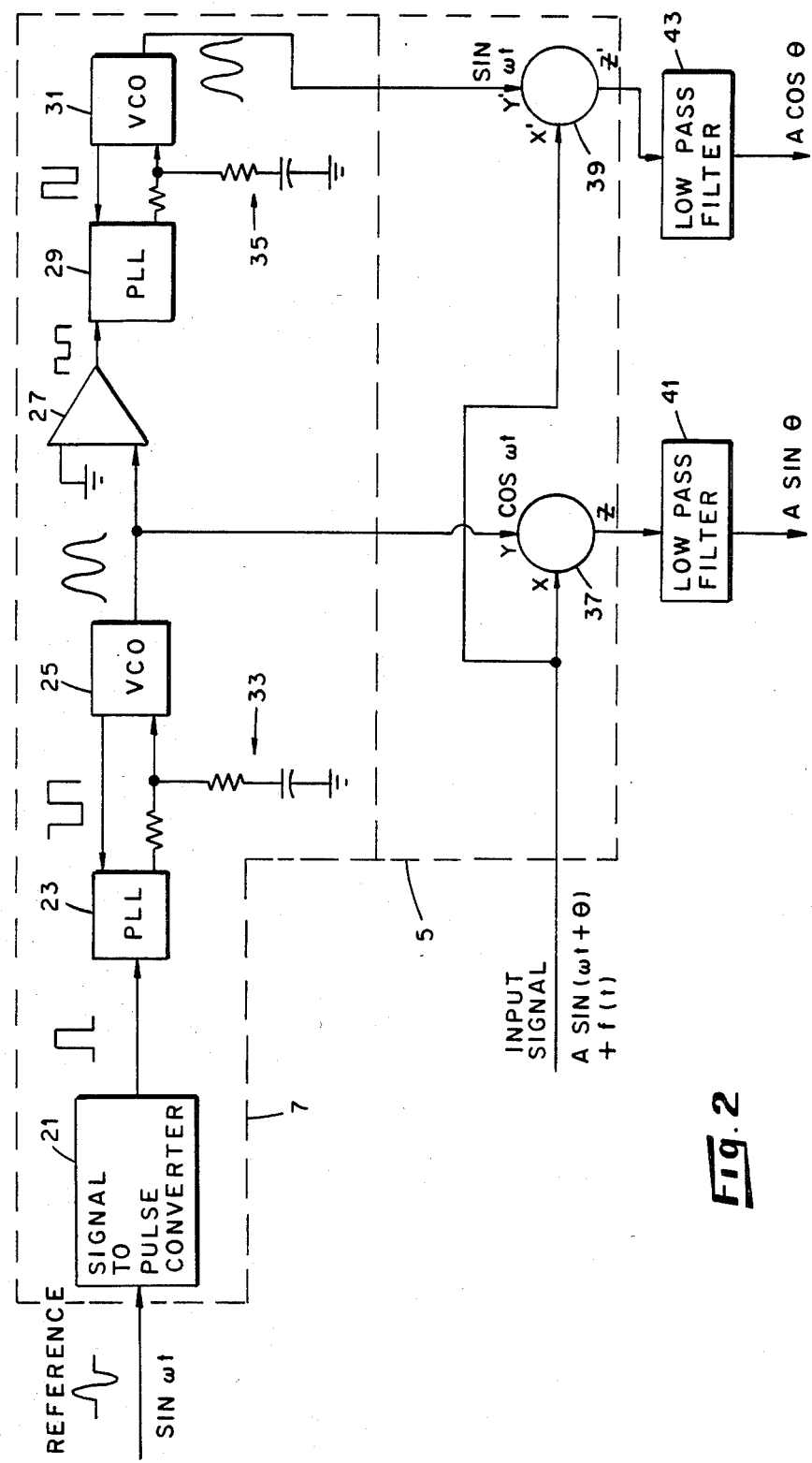
FIG. 2 is a more detailed schematic block diagram of the lock-in amplifier of FIG. 1.

Referring now to FIG. 2, the pulse generator shown within dashed lines 7 includes a signal-to-pulse converter 21, such as the Model No. LM1815 supplied by National Semiconductor, Santa Clara, Calif. The reference signal, or pulses, are applied to the input of converter 21 which generates a very narrow square wave pulse in phase with the input reference signal. This pulse is applied to a phase-locked loop (PLL) circuit 23 which controls a voltage-controlled oscillator (VCO) 25 to produce a sine wave output that is shifted 90° (K sin ($\omega t+90°$) or $-K \cos \omega t$) relative to the phase of the reference signal (sin $\omega t$). The 90° phase shift is inherent in the operation of the particular PLL 23 and VCO 25 which are commercially available integrated components, such as the PLL Model No. MC4046 supplied by Motorola Semiconductor Products Corp., Phoenix, Ariz. and the VCO Model No. ICL8038 supplied by Intersil Corp., Cupertino, Calif.

To provide a sine wave signal which is in phase with the reference signal, the 90° phase shifted sine wave from the VCO 25 is applied to the input of a comparator 27 which produces a square wave output which is in phase with the signal applied to the input of the comparator. This square wave is applied to the input of a second PLL 29 which is in turn coupled to a second VCO 31 in identical arrangement to that of the first-described PLL 23 and VCO 25. The output of VCO 31 is a sine wave (sin $\omega t$) which is in phase with the reference signal. This technique provides the necessary phase shifting of the reference signal to obtain an output even though the input signal to be detected is not in phase with the reference signal as will be described hereinbelow.

It will be noted that each of the PLL and VCO circuits (33,35) contain an additional coupling circuit in the output of each PLL to the corresponding VCO which contains a 1.33 MFD capacitor connected between the PLL output and ground potential through a resistor network. This connection allows a wide operating frequency range, for example from 10 Hz to 500 Hz depending on the desired range needed for an application. Normally, a low pass filter is used directly to control the VCO. However, to prevent frequency drift, a fast responding circuit is needed. The circuit configuration incorporated here low pass filters the input to the VCO but still allows a small portion of the signal to pass unimpeded so large fast input changes may be seen by the VCO instantly.

The outputs from the VCO's 25 and 31 are connected respectively to the Y inputs of separate analog multipliers 37 and 39 of the multiplier circuit shown within dotted lines 5. Each of the multipliers 37 and 39 is preferably a Model No. AD532 supplied by Analog Devices, Norwood, Mass. These provide an output analog signal Z that is the product of the inputs (Y * X). The input signal, which contains the signal (A sin $\omega t+\theta$) to be detected, is fed to the X inputs of analog multipliers 37 and 39. Thus, the output of multiplier 37 is a signal $Z = A \sin\theta + A \sin(2\omega t+\theta)$ and the output of multiplier 39 is a signal $Z' = A \cos\theta - A \cos(2\omega t+\theta)$.

The signals from multipliers 37 and 39 are applied to the inputs of low pass filters 41 and 43, respectively. The filters remove all of frequency components of the Z signals leaving the dc components A sin $\theta$ at the output of filter 41 and A cos $\theta$ at the output of filter 43.

Thus it will be seen that when the 90° phase shifted component of the reference signal (cos $\omega t$) and the in phase component (sin $\omega t$) are separately multiplied by the input signal, two output signals are provided from which both the amplitude of the input signal and the phase of the input signal relative to the reference signal may be obtained without the variable phase adjusting circuit as employed in earlier lock-in amplifiers. For example, a signal proportional to the amplitude of the input signal frequency component may be produced by simply applying the dc output signal to a conventional multifunction module (Model 433 supplied by Analog Devices) circuit which provides an output which is the square root of the sum of the two signals squared $$(\sqrt{(A \sin \theta)^2 + (A \cos \theta)^2} = A).$$

Further the phase angle $\theta$ may be determined by $$\theta = \tan^{-1}\frac{A \sin \theta}{A \cos \theta},$$

which may be easily implemented in a microprocessor. Further, the amplitude may also be calculated by a microprocessor.

While the invention has been described as an analog circuit, a digital circuit is also possible. All of the components of the invention can conveniently be designed into a single microprocessor. The sine wave reference may be generated by the software programmed into the microprocessor. The unknown signal can be converted to a digital signal, and the multiplication and low-pass filtering may be done in the microprocessor. This would alleviate any dc drift problems associated with the analog version.

Thus, it will be seen that a very simple lock-in amplifier is provided which in contrast to commercially available units requires no preprocessing of the input signal to suppress odd harmonics in the input signal. This leads to a significantly less expensive lock-in amplifier with improved resolution over the much more expensive commercial lock-ins. In a specific test, it has been shown that the sensitivity is improved to the point where signals may be resolved even at signal-to-noise ratios of 0.02. This is a significant improvement over the commercially available units which will resolve signals where the signal-to-noise ratio is about 0.1.

Due to the fact that this lock-in amplifier does not have to prefilter the input signal, phase shifts due to prefiltering do not exist. The amplifier is more accurate, far simpler, and has much greater sensitivity than commercially available units. Its simplicity and reduced number of components makes this lock-in amplifier attractive for use in precision instrumentation which could employ a lock-in amplifier for signal detection.

While a preferred embodiment of the invention has been described using specific terms, such description is for illustrative purposes only, and it is to be understood that changes and variations may be made without departing from the spirit or scope of the following claims.

What is claimed is:

1. A lock-in amplifier for detecting a particular frequency component of an input signal, comprising:
   a first sine wave generating means responsive to an input reference signal at an input thereof having a frequency equal to the frequency of said component of said input signal to be detected for generating a first sine wave reference signal at an output thereof which is equal in frequency to and 90° out-of-phase with said input reference signal;
   a second sine wave generating means responsive to the output of said first sine wave generating means for generating a second sine wave reference signal at an output thereof which is equal in frequency to and in phase with said input reference signal;
   a first multiplier means having a first input for receiving said input signal and a second input for receiving said first sine wave reference signal for generating a first dc signal at an output thereof which is a product of said component of said input signal to be detected and said first sine wave reference signal;
   a second multiplier means having a first input for receiving said input signal and a second input for receiving said second sine wave reference signal for generating a second dc signal at an output thereof which is a product of said component of said input signal to be detected and said second sine wave reference signal; and
   first and second low-pass filtering means connected respectively in series with the outputs of said first and second multiplier means.

2. The lock-in amplifier of claim 1 wherein said first and second multiplier means are analog multipliers.

3. The lock-in amplifier as set forth in claim 2 wherein a variable frequency reference signal generator is connected to the input of said first sine wave generating means to provide said input reference signal.

4. The lock-in amplifier as set forth in claim 1 wherein each of said first and second sine wave generating means includes means for generating a square wave signal in phase with the input signal applied thereto, a phase-locked loop connected to receive said square wave signal, and a voltage controlled oscillator coupled with said phase-locked loop so that a sine wave signal is generated at the output of said voltage controlled oscillator having a frequency equal to the frequency of said square wave applied to the input of said phase-locked loop and phase shifted 90° relative to said square wave input signal.

* * * * *